US006951603B2

(12) United States Patent
Becker et al.

(10) Patent No.: US 6,951,603 B2
(45) Date of Patent: Oct. 4, 2005

(54) METHOD OF PRODUCING A CONDUCTIVE STRUCTURED POLYMER FILM

(75) Inventors: Eike Becker, Braunschweig (DE); Hans-Hermann Johannes, Vechelde (DE); Wolfgang Kowalsky, Braunschweig (DE)

(73) Assignee: Technische Universitat Braunschweig, Braunschweig (DE)

( * ) Notice: Subject to any disclaimer, the term of this patent is extended or adjusted under 35 U.S.C. 154(b) by 70 days.

(21) Appl. No.: 10/225,054

(22) Filed: Aug. 21, 2002

(65) Prior Publication Data

US 2003/0052015 A1 Mar. 20, 2003

(30) Foreign Application Priority Data

Aug. 24, 2001 (DE) ........................................ 101 40 666

(51) Int. Cl.[7] ............................ C25D 1/00; C25D 1/04; C25D 5/02; C25D 5/10; C23C 28/00

(52) U.S. Cl. .......................... 205/118; 205/67; 205/76; 205/77; 205/122; 205/123; 205/129; 205/170; 205/196; 205/317

(58) Field of Search ................................ 205/118, 122, 205/123, 129, 317, 67, 76, 77, 170, 196

(56) References Cited

U.S. PATENT DOCUMENTS

| | | | | |
|---|---|---|---|---|
| 3,446,874 A | * | 5/1969 | Varker | 525/247 |
| 4,468,291 A | * | 8/1984 | Naarmann et al. | 205/77 |
| 4,559,112 A | * | 12/1985 | Tamamura et al. | 205/50 |
| 5,107,308 A | | 4/1992 | Koezuka et al. | 357/8 |

FOREIGN PATENT DOCUMENTS

JP 61243197 A * 10/1986 ........... C25D/13/08

OTHER PUBLICATIONS

Hikita et al., "Patterning of Conductive Polypyrrole in Polymer Film", Japanese Journal of Applied Physics, vol. 24, No. 2, Feb. 1985, pp. L79–L81.*

Gorman et al., "Fabrication of Patterned, Electrically Conducting Polypyrrole Using a Self–Assembled Monolayer: A Route to Al Organic Circuits", Chem. Mater., (no month, 1995), vol. 7, pp. 526–529.*

Zheng et al., "Electrochemical Patterning of the Surface of Insulators with Electrically Conductive Polymers", J. Electrochem. Soc. vol. 142, No. 12, Dec. 1995.*

Patent Abstracts of Japan, Publication No. 05206140 A, Date of Publication Aug. 1993, "Circuit Device and Manufacture Thereof".

Patent Abstracts of Japan, Publication No. 02017635 A, Date of Publication Jan. 1990, "Pattern Forming Method".

(Continued)

*Primary Examiner*—Edna Wong
(74) *Attorney, Agent, or Firm*—Fay, Sharpe, Fagan, Minnich & McKee, LLP

(57) ABSTRACT

A two-layered anode (1') has a lower layer (2) including a non-conductive carrier material to which a conductive electrode layer (3') is applied. Non-conductive areas, formed by partial removal of the electrode layer, have a predetermined structure corresponding to the structure of a structured polymer film (11) to be formed. The anode (1') is connected with a platinum cathode in an electrolyte into which compounds of low molecular weight, preferably monomers of the polymer film (11), are introduced. During current flow, a conductive polymer film (11) of the predetermined structure is formed on conductive areas brought into contact with the electrolyte. A non-conductive substrate layer (13) is applied to the structured polymer film (11). The structured polymer film (11) adheres to the non-conductive substrate layer (13) and can be released from the electrode (1') without damaging the electrode.

25 Claims, 3 Drawing Sheets

OTHER PUBLICATIONS

Xiang–Yang Zheng et al.: "Electrochemical Patterning of the Surface of Insulators with Electrically Conductive Polymers" in "J. Electrochem. Soc." 142 (1995) 12, pp. L226–L227, no month.

Christopher B. Gormann: "Fabrication of Patterned, Electrically Conducting Polypyrrole Using a Self–Assembled Monolayer: A Route to All–Organic Circuits" in "Chem. Mater.", 7 (1995) 3, pp. 526–529, no month.

W. Kobel et al.: "Generation of Micropatterns in Poly(3–Methylthiophene) Films Using Microlithography: A first step in the Design of an All–Organic Thin–Film Transistor" in "Synthetic Metals", 22(1988), pp. 265–271.

Makoto Hikita et al.: "Platterning of Conductive Polypyrrole in Polymer Film" in "Japanese Journal of Applied Physics", 24 (1985)2, pp. L. 79–L81, no month.

* cited by examiner

METHOD OF PRODUCING A CONDUCTIVE STRUCTURED POLYMER FILM

FIELD OF THE INVENTION

The invention relates to a method of producing a conductive structured polymer film.

DESCRIPTION OF THE PRIOR ART

Such conductive structured polymer films are used for the production of integrated circuits in polymer electronics. For example, field-effect transistors can be made up of polymeric conductor structures. In such field-effect transistors the channel provided between the source electrode and the drain electrode must have a length in the range below 10 $\mu$m, since the organic semiconductor materials introduced into the channel have low charge carrier mobility.

It is planned to produce structured polymer films as mass-produced articles, for example for smart warehouse labels or for smart goods labels for monitoring the goods transport. For this it is necessary for the production to be extremely cost-effective.

Various methods of producing polymeric conductor structures have been known hitherto. For example, polymeric conductive tracks can be produced with the aid of known printing processes such as screen printing or tampon printing or with the aid of the principle of ink-jet printing. However, only a low resolution can be achieved with these printing processes. Therefore they are not suitable for producing polymeric field-effect transistors. Moreover, these printing processes require that the conductive polymers used are soluble in an easily volatile solvent. Therefore the number of polymers suitable for the known printing processes is limited.

A modification of these printing processes is also known, with which a higher resolution can be achieved. In this modified printing process the substrate is pre-structured by making selected areas hydrophilic and the other areas hydrophobic. The printing is then carried out with an aqueous solution of a conductive polymer which is only distributed on the hydrophilic areas. In this process too it is only possible to use soluble conductive polymers. Furthermore, this process also has the disadvantage that the substrate must be pre-structured. The costs of this are considerable. Therefore this process is not suitable for mass production of structured polymer films.

It is also known for a substrate to be initially coated over the entire surface with an electrically conductive polymer, a photoinitiator being admixed with the polymer. By subsequent exposure of the polymer layer to UV light through a mask, insulating areas can be produced in the conductive polymer film. This method has the disadvantage that first of all the entire substrate must be coated with the conductive polymer, although ultimately only a small part is used as conductive structure. This is very costly, since the conductive polymers constitute a considerable cost factor.

In a further similar method the electrical properties of a conductive polymer film applied to the entire surface of a substrate are selectively altered by selective application of an ion-containing liquid or selective heating of the conductive polymer film. This method is also expensive and unsuitable for mass production because of the conductive polymer film applied over the entire surface.

Finally, WO 97/18944 describes a method of producing a structured polymer film which is based on the known photolithographic technology. In this case a conductive polymer layer is again applied to the entire surface of a substrate layer, and a photoresist which is exposed to light through a mask is applied to the polymer layer. The exposed areas of the photoresist layer are removed. Then the conductive polymer is etched away in the areas which are no longer covered. Also in this method a conductive polymer layer is applied over the entire surface. The material consumption and the costs thereof are correspondingly high. Moreover, the method is very complex because four process steps are necessary.

OBJECT OF THE INVENTION

The object of the invention is to make possible a high resolution of conductive structured polymer films with low production costs.

SUMMARY OF THE INVENTION

This object is achieved according to the invention in that a) an electrode is used, the surface of which has conductive areas of a predetermined structure and non-conductive areas, b) at least a part of the conductive areas is brought into contact with an electrolyte, compounds of low molecular weight, preferably monomers, being introduced into the electrolyte, c) a current flow over the electrode is generated by the electrolyte, a conductive polymer film of the predetermined structure being formed on the conductive areas which have brought into contact with the electrolyte, and d) after this the structured polymer film which has been formed is removed from the electrode.

With the invention it is possible for the first time to produce conductive structured polymeric films with a high resolution cost-effectively. During the production the electrode is only provided one single time with conductive areas on its surface and can then be used as often as required for the deposition of a conductive polymer film of the predetermined structure. For the conductive areas of the electrode a material should be chosen onto which the polymer to be deposited adheres sufficiently well but not too strongly. Since the structuring of the surface of the electrode is only necessary once, any known methods, even costly ones, for the structuring can be used. The proportion of the total production costs accounted for by the conductive structure polymer film is negligible in the mass production of identical polymer films because the electrode can be reused.

The method also has the advantage that a conductive polymer is deposited only where it is actually necessary because of the structure. Thus the material consumption and the corresponding costs in the production of the conductive polymer film can be limited to a minimum. Not only monomers but also dimers or other short-chained basic components of polymers can be introduced into the electrolyte as compounds of low molecular weight. Also various types of compounds of low molecular weight can be combined. The choice of these is governed by the polymer material to be produced. The monomers or other compounds of low molecular weight are deposited onto the conductive areas, whereby an electrochemical polymerisation takes place. The polymer film which is formed is doped with ions from the electrolyte so that it becomes conductive.

The structured polymer film can be removed from the electrode in any way. The electrode is not attacked or damaged by the deposition process nor by the removal of the structured polymer film. Therefore it can be used immediately for the production of the next conductive structured polymer film. The electrolyte can be used a number of times until the compounds of low molecular weight, for example a specific monomer, introduced into it are exhausted or it can be regenerated in stages or continuously.

A particular advantage of the production method according to the invention is that, unlike many known methods, insoluble polymers can also be produced. This creates additional scope for the further process steps for the production of an integrated polymer circuit. It is also advantageous that the method according to the invention merely operates wet-chemically and only comprises two steps. Therefore with this method conductive structured polymer films can be produced quickly and simply. Because of the additional saving on material the cost advantage over known methods is enormous.

A preferred embodiment is characterised in that in step d) the structured polymer film is transferred to a substrate. In order to transfer the structured polymer film to the substrate a non-conductive substrate layer is preferably applied to the electrode over a large area on the polymer film side, preferably covering the entire structured polymer film, the substrate layer being selected so that the structured polymer film adheres to it or can be glued to it thermally or photochemically. For the non-conductive areas a material should be chosen on which the substrate layer to which the structured polymer film is transferred does not adhere too strongly. For the photochemical glueing suitable adhesives are those which harden on exposure to ultraviolet light. Such adhesives are commercially obtainable.

A further development of the method is characterised in that in order to form the non-conductive substrate layer a solution of a non-conductive polymer dissolved in a volatile solvent is applied, that the solvent is converted into the gaseous aggregate state and that then the structure polymer film adhering to the substrate layer is removed from the electrode. The conversion to the gaseous aggregate state can take place by vaporisation or evaporation.

A preferred embodiment of the invention is characterised in that a flexible substrate layer is used which has a thickness of 50 $\mu$m to 1 mm, preferably 0.4 to 0.6 mm. The use of a flexible substrate layer which is so thin has the advantage that it can cling well to the structured polymer film which is formed. Furthermore a flexible substrate layer enables simple production which can be automated. The flexible substrate layer can be unwound as a sheet from a storage reel and after the application of one or more structured polymer films it can be wound onto a winding reel.

Depending upon the field of application it may be advantageous to apply a stabilising layer to the side of the substrate layer remote from the structured polymer film and to glue the stabilising layer to the substrate layer thermally or photochemically. Of course, the stabilising layer can also be constructed as a flexible sheet and after glueing to a flexible substrate layer it can be wound on together with the substrate layer and the structured polymer film applied thereto.

An important embodiment of the invention is characterised in that the conductive and/or non-conductive areas are structured so that at least a part of their lateral dimensions is below 50 $\mu$m, preferably below 10 $\mu$m.

A further embodiment of the invention is characterised in that an electrode with at least two layers is used, wherein in its production a conductive electrode layer is applied to the entire surface of a lower layer made from a non-conductive carrier material, the electrode layer being removed in part-areas in order to form the non-conductive areas.

A high resolution in the production of the conductive areas of the predetermined structure can be achieved by producing the conductive and non-conductive areas using a photolithographic method.

Alternatively an electrode with at least three layers can be used, wherein the lower layer is made from a carrier material on which a conductive electrode layer is applied over the entire surface, and wherein the conductive electrode layer is covered with an insulator layer in part-areas in order to form the non-conductive areas. The material of the insulator layer should be chosen so that the substrate layer does not adhere too much to it.

The current flow in step c) is preferably generated by electrically contacting the conductive areas on the electrode and connecting them via a current or voltage source to a counter-electrode, and by bringing at least a part of the surface of the counter-electrode into contact with the electrolyte. The film thickness can be checked by measurement of the transported electrical charge. When the desired film thickness is reached the voltage is switched off and the electrode is removed from the electrolyte.

It has been shown that the structured polymer film which is formed is particularly homogeneous due to the fact that a voltage between 1 and 100 volts, preferably 10 volts, is applied between the electrode and counter-electrode by the voltage source.

In a preferred embodiment the electrode is connected as anode and the counter-electrode as cathode. The cathode should be made from a material which is suitable for carrying out the electropolymerisation.

A further embodiment of the invention is characterised in that an electrode and/or counter-electrode is used which contains glass as carrier material. The material costs for this are low. Moreover the use of glass allows all-round visual checking of the electrochemical process.

An electrode with a conductive electrode layer of indium tin oxide is preferably used. It has proved worthwhile for at least the part of the surface of the cathode which is brought into contact with the electrolyte to be made from platinum or gold. A thin platinum film can be vapour-deposited for example on a carrier layer of glass.

A further development of the invention is characterised in that pyrroles, 3-alkylpyrroles, particularly 3-methyl-, 3-ethyl-, 3-propylpyrroles, N-alkylpyrroles, particularly N-methyl-, N-ethyl-, N-arylpyrroles, particularly N-phenyl-, N-(4-amino)phenyl-, N-(4-methoxy)phenyl-, N-naphthylpyrroles, N-heteroarylpyrroles, particularly N-(3-thienyl)-, N-(2-thienyl)-, N-(3-furanyl)-, N-(2-furanyl)-, N-(3-selenophenyl)-, N-(2-selenophenyl), N-(3-pyrrolyl)pyrroles, thiophenes, 3-alkylthiophenes, particularly 3-methyl-, 3-ethyl-, 3-propylthiophenes, furans, 3-alkylfurans, 3-methyl-, 3- ethyl-, 3-propylfurans, selenophenes, 3-alkylselenophenes, particularly 3-methyl-, 3-ethyl-, 3-propylselenophenes, tellurophenes, anilines, biphenyls, azulenes, 2-alpha-(3-alkyl)thienyl)thiophenes, 2-(alpha-(3-alkyl)thienyl)-(3-alkyl)thiophenes, 2-(alpha-thienyl)furans, 2-(alpha-(3-alkyl)thienyl)furans), 2alpha-(3-alkyl)thienyl)-(3-alkyl)furan, 2-(alpha-thienyl)-(3-alkyl) furans, 2-(alpha-thienyl)pyrroles, 2-(alpha-(3-alkyl)thienyl) pyrroles, 2-(alpha-(3-alkyl)thienyl)-(3-alkyl)pyrroles, 2-(alpha-thienyl)-(3-alkyl)pyrroles, 2-(alpha-furanyl) pyrroles, 2-(alpha-(3-alkyl)furanyl)pyrroles, 2-(alpha-(3-alkyl)furanyl)-(3-alkyl)pyrroles, 2-(alpha-furanyl)-(3-alkyl) pyrroles, 2-(alpha-pyrrolyl)pyrroles, 2-(alpha-(3-alkyl)

pyrrolyl)pyrroles, 2-(alpha-(3-alkyl)pyrrolyl)-(3-alkyl) pyrroles, 2-(alpha-pyrrolyl)-(3-alkyl)pyrroles, 2-(alpha-selenophenyl)selenophenes, 2-(alpha-(3-alkyl) selenophenyl)selenophenes, 2-(alpha-(3-alkyl) selenophenyl)-(3-alkyl)selenophenes, 2-(alpha-thienyl) selenophenes, 2-alpha-(3-alkyl)thienyl)selenophenes, 2-(alpha-(3-alkyl)thienyl)-(3-alkyl)selenophenes, 2-(alpha-thienyl)-(3-alkyl)selenophenes, 2-(alpha-selenophenyl) furans), 2-(alpha-(3-alkyl)selenophenyl)furans, 2-(alpha-(3-alkyl)selenophenyl)-(3-alkyl)furans, 2-(alpha-selenophenyl)-(3-alkyl)furans, 2-(alpha-selenophenyl) pyrroles, 2-(alpha-(3-alkyl)selenophenyl)pyrroles, 2-(alpha-(3-alkyl)selenophenyl)-(3-alkyl)pyrroles, 2-(alpha-selenophenyl)-(3-alkyl)pyrroles, thienothiophenes, thienofurans, thienoselenophenes, thienopyrroles, 2-phenylthiophenes, 2-phenylfurans, 2-phenylpyrroles, 2-phenylselenophenes, 2-phenyltellurophenes, N-vinylcarbazole, N-ethynylcarbazone, 3,4-ethylenedioxythiophenes, 2-(alpha-(3,4,ethylenedioxy) thaenyl)thiophenes, 2-(alpha-(3,4-ethylenedioxy)thienyl)-3,4-ethylenedioxythiophenes, 2-(alpha-(3,4-ethylenedioxy) thienyl-(3-alkyl)thiophenes, 2-(alpha-(3,4-ethylenedioxy) thienyl)furans, 2-(alpha-(3,4-ethylenedioxy)thienyl)-(3-alkyl)furans, 2-(alpha-(3,4-ethylenedioxy(thienyl)pyrroles, 2-(alpha-(3,4-ethylenedioxy)thienyl)-(3-alkyl)pyrroles, 2-(alpha-(3,4-ethylenedioxythienyl)selenophenes or 2-alpha-(3,4-ethylenedioxythienyl)-(3-alkyl)selenophenes in each case individually or in any combination or as oligomeric monomer units are used as compounds of low molecular weight.

A suitable electrolyte can be produced by using a preferably organic solvent in which a salt is dissolved. In this case the electrolyte should be chosen so that the compounds of low molecular weight are also readily soluble in it. Furthermore the solvent must allow an electrochemical polymerisation.

Since the structured polymer film which is formed is doped with ions from the electrolyte during deposition, the electrolyte has a direct influence on the material characteristics of the structured polymer film. The conductivity of the structured polymer film depends strongly upon the quantity of ions in the polymer film. In order to reduce or increase the conductivity of the polymer film, after the polymerisation the electrode coated with the structured polymer film together with a second counter-electrode can be dipped into a second electrolyte which, apart from the solvent, contains only the salt, i.e. no monomers. The second counter-electrode can be made from the same or a similar material to the first counter-electrode. The first counter-electrode can also be used as second counter-electrode. The quantity of ions in the structured polymer film can be altered by the application of a voltage between the electrode and the second counter-electrode. With a voltage in the reverse direction by comparison with the polymerisation the quantity of ions is reduced. Thus the conductivity drops and the structured polymer film becomes almost insulating. With a voltage in the same direction as in the polymerisation the quantity of ions in the polymer film is increased and the conductivity possibly rises. However, it is limited by the electrical characteristics of the polymer.

It has been shown that when an organic solvent is used the deposited structured polymer film can be released particularly easily from the electrode.

Propylene carbonate, acetonitrile, monovalent or polyvalent alcohols, tetrahydrofuran or water are advantageously used in each case individually or in any mixture as solvent.

Good polymerisation results can be achieved by the use of tetraethylammonium-tetrafluoroborate, tetraethylammonium-hexafluorophosphate, tetraethylammonium-perchlorate or poly(styrenesulphonic acid) sodium salt in each case individually or in any combination as salt.

In a preferred embodiment a structured polymer film is produced with a thickness of 0.1 to 2 $\mu$m, preferably 0.4 to 0.6 $\mu$m.

The economically favourable production of the conductive structure polymer film consists of using a rotatable, preferably circular cylindrical electrode which is disposed in such a way that during the rotation the conductive areas dip into the electrolyte and then are moved out of the electrolyte.

When a rotatable electrode is used the production method can be automated particularly simply, so that a continuous or quasi-continuous production is possible. The electrode can be turned in stages so that in each case simultaneously the lower area of the electrode dips into the electrolyte and a structured conductive film which is already ready can be removed from the upper area of the electrode. As soon as a conductive polymer layer of sufficient thickness has been deposited on the conductive area located in the electrolyte the electrode can be turned by such an amount that the next portion of the electrode with conductive areas dips into the electrolyte and simultaneously a further structured polymer film which is ready can be removed from the electrode. Of course, the rotation of the electrode can also take place continuously instead of in stages. A revolving electrode band which in the lower region dips into the electrolyte and in the upper region projects out of the electrolyte can also be used as a rotatable electrode.

A significant further development is characterised in that after step c) at least a part of the structured polymer film formed on the electrode is brought into contact with a solution of a metal salt and that a current flow through the solution of the metal salt is produced via the electrode, a metal film being formed on the structured polymer film brought into contact with the solution of the metal salt. By the use of the structured polymer film as "intermediate layer" between electrode and metal film, the metal film can be removed from the electrode without problems. Without an intermediate layer the metal film would adhere very strongly to the electrode. The electrode can be reused.

The method enables a continuous production of large quantities of structured metal films, Before step d) a substrate is preferably applied to the metal film on the side remote from the structured polymer film. The metal film can be glued thereto or to a suitable conductive substrate. Depending upon the desired application the conductive structured polymer film can then be removed. When a plastic film is used as substrate, plastic films coated with finely structured metal films can be produced using this method.

A preferred use of the method according to the invention is the production of a conductor structure containing source and drain electrode at least of a field-effect transistor.

The invention also includes an arrangement for the production of a conductive structured polymer film which is characterised by a) an electrode and a counter-electrode, the surface of the electrode having conductive areas of a predetermined structure and non-conductive areas, b) a container containing an electrolyte, the electrode and the counter-electrode being so disposed that at least a part of the conductive areas of the electrode and a part of the surface of the counter-electrode can be brought into contact with the electrolyte, the electrolyte containing compounds of low molecular weight, preferably monomers, c) a current or voltage source electrically connected to the electrode and the counter-electrode in order to produce a current flow through the electrolyte.

The construction of the arrangement according to the invention is simple and allows easy handling. With it, conductive structured polymer films can be produced quickly and extremely cost-effectively as mass production.

Advantageous embodiments of the invention are characterised in the subordinate claims.

The invention is explained in greater detail below with reference to embodiments which are illustrated schematically in the drawings.

DESCRIPTION OF THE PREFERRED EMBODIMENT

Figure 1A:
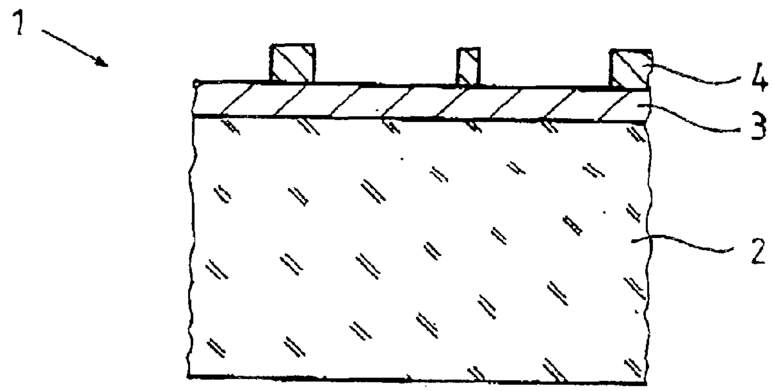
FIG. 1*a* shows a sectional view of a three-layered electrode portion for carrying out the method according to the invention.

FIG. 1*a* shows a three-layered electrode which is used for carrying out the method according to the invention. The electrode 1 consists of three layers. The lowest layer 2 consists of a carrier material, glass in this embodiment. The middle layer 3 is a conductive layer of indium tin oxide. This conductive layer 3 covers the carrier layer 2 completely. An insulator layer 4 is applied to the conductive layer 3 on the side remote from the carrier layer. The insulator layer 4 only covers the conductive layer in part-areas. In these part-areas which are covered by the insulator layer 4 no polymer film is deposited during the electrochemical polymerisation. The insulator layer 4 is applied to the conductive layer 3 so that the areas of the conductive layer 3 which remain free have a predetermined structure which corresponds to the structure of the polymer film to be formed.

Figure 1B:
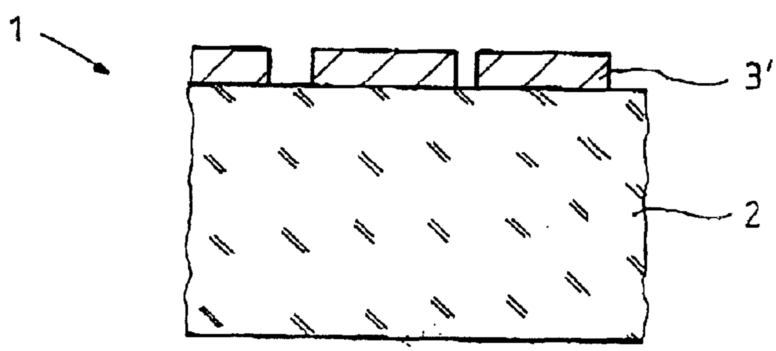
FIG. 1*b* shows a sectional view of a two-layered electrode portion for carrying out the method according to the invention.

As an alternative to the electrode illustrated in FIG. 1, the electrode illustrated in FIG. 1*b* can be used. This has only two layers. A conductive layer 3' of indium tin oxide (surface resistance 20Ω/¬) is again applied to the lower layer 2 of glass. This conductive layer 3' has been removed in part-areas using a lithographic process. In this way an electrode surface with conductive areas of a predetermined structure can also be produced with two layers.

Figure 2:
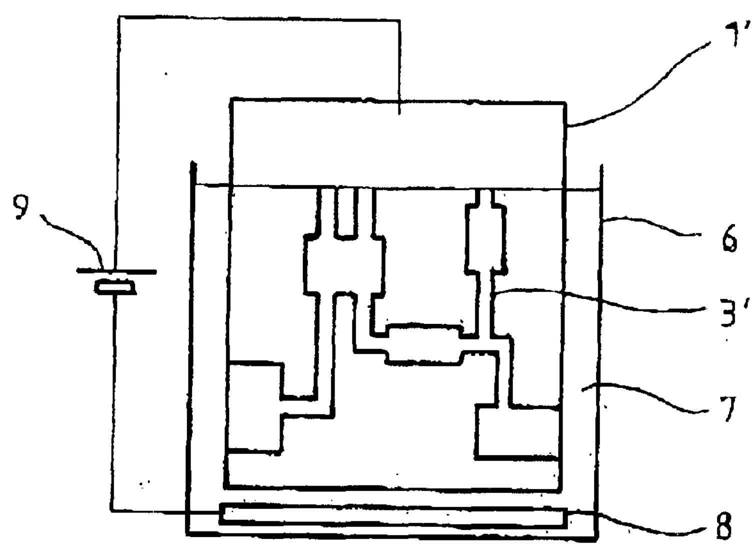
FIG. 2 shows schematically an arrangement according to the invention for the production of a conductive structured polymer film.
Figure 3:
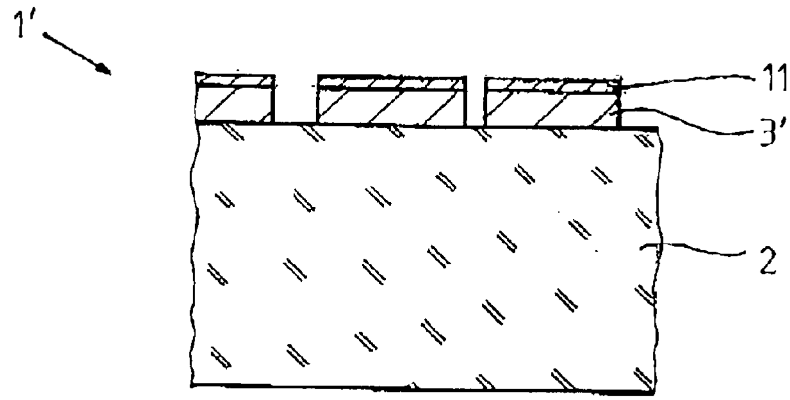
FIG. 3 shows a sectional view of the electrode portion according to FIG. 1*b* with structured polymer film deposited thereon.
Figure 4:
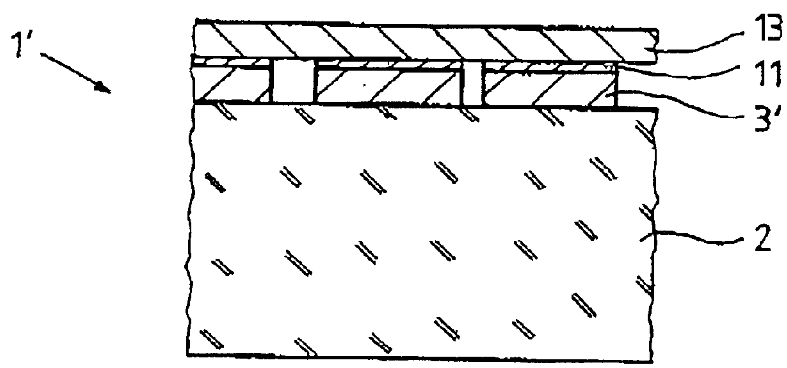
FIG. 4 shows a sectional view according to FIG. 3 after the application of a substrate film.
Figure 5:
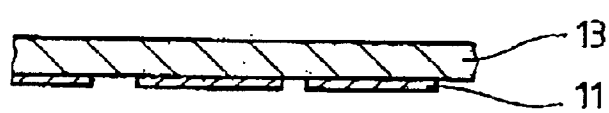
FIG. 5 shows a sectional view of the structured polymer film according to FIG. 4 released with the substrate layer.
Figure 6:
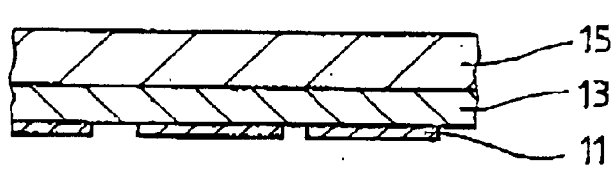
FIG. 6 shows a side view of the released structured polymer film with substrate layer and stabilising layer.

FIG. 2 shows a schematic construction for carrying out the method according to the invention. In this embodiment a structured polymer film is produced from doped poly(3-methylthiophene). The electrode 1' according to FIG. 1*b* is an anode and is suspended in a container 6 which is filled with an electrolyte 7. The electrolyte consists of a solution of 0.03 M $Et_4NBF_4$ in dry polypropylene carbonate. 0.2 M 3-methylthiophene are introduced into the electrolyte 7. A rod-shaped cathode 8 made from platinum is disposed below the anode 1' in the container. The anode 1' and the cathode 8 are connected to a voltage source 9. The structured conductive layer 3' is completely covered by the electrolyte 7. When the voltage source 9 is switched on a voltage of 10 volts is applied between the anode 1' and the cathode 8. An electrochemical polymerisation takes place on the conductive areas and in the course of this a polymer film consisting of doped poly(3-methylthiophene) is deposited with a structure corresponding to the conductive areas of the structured conductive layer 3' of the anode 1'. As soon as the deposited polymer film has the desired thickness of 0.5 μm (after approximately 30 seconds) the voltage can be switched off and the anode 1' can be removed from the electrolyte. The anode 1' with the structured polymer film 11 formed on its conductive areas is illustrated in FIG. 3. The conductivity of the poly(3-methylthiophene) film which is produced is in the region of 10 S $cm^{-1}$. A solution of polyvinyl chloride (PVC) dissolved in tetrahydrofuran (16% by weight) is then applied to the entire surface of the anode on the polymer film side. After the vaporisation of the solvent tetrahydrofuran, the insulating substrate layer 13 is formed on which the conductive structured (3-methylthiophene) film 11 adheres. The corresponding arrangement of layers consisting of the lower layer 2 of glass, the structured conductive layer 3' of the anode, the conductive structured polymer layer 11 and substrate layer 13 is illustrated in FIG. 4. The substrate layer 13, including the conductive polymer film 11, is then withdrawn from the anode 1'. As is shown in FIG. 5, the conductive structured polymer film 11 then only adheres on the substrate layer 13. For stabilisation, a stabilising layer can be applied to the side of the substrate layer 13 remote from the structured polymer film 11 and the stabilising layer 15 can be thermally glued to the substrate layer 13 (FIG. 6).

Figure 7:
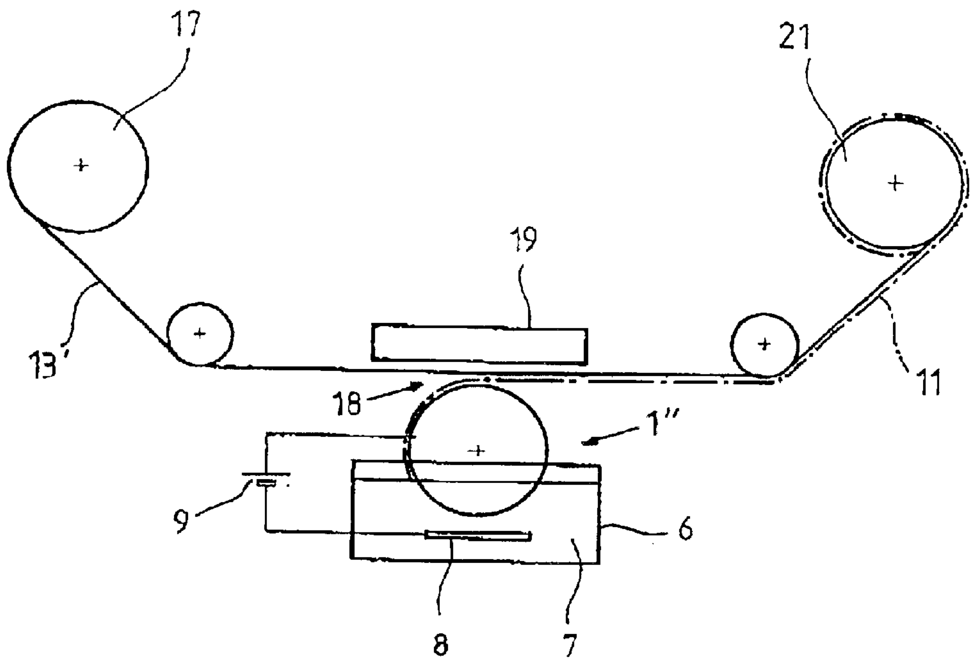
FIG. 7 shows schematically a station for the continuous production of a structured polymer film.

A particularly economical production of the conductive structured polymer film 11 is described with the aid of the illustration in FIG. 7. In this embodiment a structured polymer film of doped poly(3,4-ethylenedioxythiophene) is produced. A circular cylindrical anode 1" is used which is suspended rotatably. The anode is disposed so that the conductive area (not shown) run through the electrolyte 7 during the rotation of the anode. The electrolyte consists of a solution of 0.05 M $Et_4NBF_4$ in dry propylene carbonate. 0.05 M 3,4-ethylenedioxythiophene are introduced into the electrolyte.

A thin substrate layer or sheet 13' of polymer film with a thickness of 1 mm is withdrawn from a storage reel 17, redirected and moved into the region of the anode 1". In the region of the anode 1" a structured polymer film is formed in stages or continuously, as already described. The conductivity of the poly(3,4-ethylenedioxythiophene) which is produced is in the region of 400 S $cm^{-1}$. The structured polymer film is brought into contact with the substrate sheet 13 in the region 18. A heating device 19 is provided in this region, and with the aid of this device the structured polymer film is thermally glued to the substrate sheet. The sheet is then wound onto a winding reel 21. In this way large quantities of the structured polymer film with a high resolution can be produced simply and cost-effectively.

Figure 8:
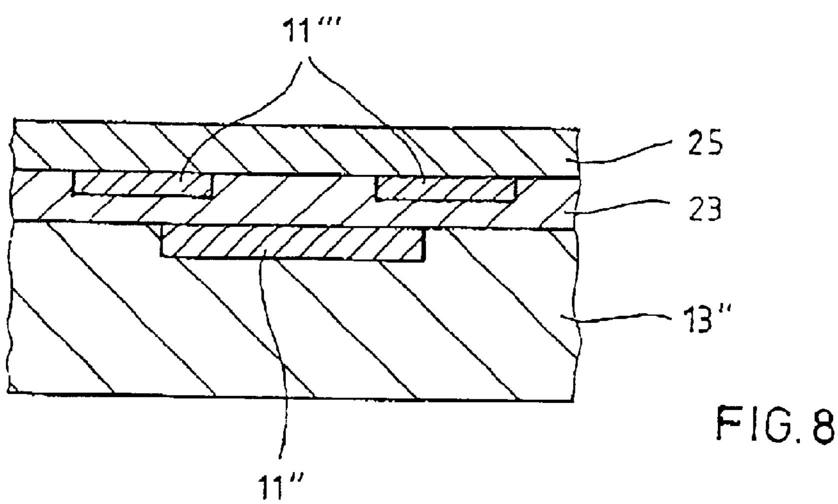
FIG. 8 shows a sectional view of a layer arrangement for a field-effect transistor.

Finally, layered arrangements can also be produced using the method according to the invention. FIG. 8 shows a sectional view of a layered arrangement for a field-effect transistor. First of all a conductive structured polymer film 11" is produced which contains a gate electrode structure. This polymer film 11" with the gate electrode structure is transferred to a substrate 13". Then a second conductive structured polymer film 11'" is produced which contains a source and drain electrode structure. On the anode a PVC film 23 with a thickness of for example 1 μm is also applied, preferably spun on, to this second polymer film 11'", and by way of this PVC film the second polymer film 11'" is then glued thermally or photochemically to the first polymer film. The layered arrangement consisting of substrate layer 13", first polymer film 11", thin PVC film 23 and second polymer film 11'" is then removed from the anode. In order to complete the transistor, a layer 25 of a suitable organic semiconductor material is then applied, for example by spinning on, to the second polymer film 11". Examples of suitable organic semiconductor materials are: poly(3-hexylthiophene), poly(thienylvinyls), pentacene and alpha-sexithiophene.

In this way transistors can be produced quickly, simply and extremely cost-effectively.

Within the scope of the idea of the invention numerous modifications are possible. The choice of the electrode layers, the composition of the electrolyte and also the compounds of low molecular weight introduced into the electrolyte can be adapted to the desired end structures. Also the geometric shape of the electrodes and the geometric dimensions of the conductive and non-conductive areas can be varied in any way. The conductive areas can be electrically contacted using any techniques. It has proved particularly worthwhile if the electrolyte is stirred continuously during the deposition. The anode with the structured polymer film deposited on it can be washed with isopropanol and dried with nitrogen before the removal of the polymer film. Also the temperature chosen for the thermal glueing, preferably 110° C., and the thermal treatment time chosen for this, preferably 20 minutes, can be varied in any way. Also the arrangement of layers can be chosen freely. Of course, two structured polymer films each disposed on a substrate layer can be glued to one another, possibly using one or more intermediate layers. Finally, for the electrochemical deposition of metal layers it is also possible to use homogeneous conductive polymer films as intermediate layer. The result then is not structured but equally homogeneous metal films, The homogeneous or structured conductive polymer films can be produced using any other methods instead of the electrochemical method.

What is claimed is:

1. A method of producing a conductive structured polymer film, comprising the steps of:

a) providing an electrode having a surface with conductive areas of a predetermined structure and with non-conductive areas, b) bringing at least a part of the conductive areas into contact with an electrolyte, said electrolyte containing compounds of low molecular weight, c) generating a current flow through the electrolyte with the aid of the electrode, a conductive polymer film of the predetermined structure being formed on the conductive areas which have been brought into contact with the electrolyte, d) applying a solution comprising a non-conductive polymer to the structured polymer film to form a non-conductive substrate layer, and e) then removing the structured polymer film adhering to the substrate layer, which has been formed from the electrode, leaving the electrode intact, thereby allowing the electrode to be reused.

2. The method as claimed in claim 1, wherein the substrate layer is a flexible substrate layer and has a thickness of 50 μm to 1 mm.

3. A method comprising:

a) providing an electrode having a surface with conductive areas of a predetermined structure and with non-conductive areas, b) bringing at least a part of the conductive areas into contact with an electrolyte, said electrolyte containing compounds of low molecular weight, c) generating a current flow through the electrolyte with the aid of the electrode, a conductive polymer film of the predetermined structure being formed on the conductive areas which have been brought into contact with the electrolyte, d) bringing at least a part of the structured polymer film formed on the electrode into contact with a solution of a metal salt, e) producing a current flow through the solution of the metal salt via the electrode, a metal film being formed on the structured polymer film brought into contact with the solution of the metal salt, and f) then removing the structured polymer film which has been formed from the electrode.

4. The method as claimed in claim 3, wherein in step f the structured polymer film is transferred to a substrate.

5. The method as claimed in claim 4, wherein before step f) a non-conductive substrate layer is applied to the structured polymer film, the substrate layer being selected from the group of substrate layers consisting of substrate layers on which the structured polymer film adheres, substrate layers which can be thermally glued to the structured polymer film, and substrate layers which can be photochemically glued to the structured polymer film.

6. The method as claimed in claim 5, wherein a non-conductive polymer is dissolved in a volatile solvent to form a solution, thereafter the solution is applied to the structured polymer film in order to form the non-conductive substrate layer, and wherein furthermore the solvent is converted into a gaseous aggregate state and then the structured polymer film adhering to the substrate layer is removed from the electrode.

7. The method as claimed in claim 3, wherein before step f) a substrate is applied to the metal film on the side remote from the structured polymer film.

8. A method of producing a conductive structured polymer film, comprising the steps of:

a) providing an electrode having a surface with conductive areas of a predetermined structure and with non-conductive areas, b) bringing at least a part of the conductive areas into contact with an electrolyte, said electrolyte containing compounds of low molecular weight, c) generating a current flow through the electrolyte with the aid of the electrode, a conductive polymer film of the predetermined structure being formed on the conductive areas which have been brought into contact with the electrolyte.

d) dissolving a non-conductive polymer in a volatile solvent to form a solution, e) applying the solution to the structured polymer film to form a non-conductive substrate layer, the non-conductive substrate layer being selected such that the structured polymer film adheres to it, f) converting the solvent to a gaseous aggregate state, and g) removing the structured polymer film which has been formed from the electrode, leaving the electrode intact.

9. The method as claimed in claim 8, wherein the substrate layer is a flexible substrate layer and has a thickness of 50 μm to 1 mm.

10. The method as claimed in claim 8, wherein a stabilising layer is applied to the side of the substrate layer remote from the structured polymer film, the stabilising layer being thermally glued to the substrate layer.

11. The method as claimed in claim 8, wherein a stabilising layer is applied to the side of the substrate layer remote from the structured polymer film and the stabilising layer is photochemically glued to the substrate layer.

12. The method as claimed in claim 8, wherein the conductive and non-conductive areas are structured so that at least a part of their lateral dimensions is below 50 μm.

13. The method as claimed in claim 8, wherein the electrode includes at least two layers, and wherein in its production, a conductive electrode layer is applied to the entire surface of a lower layer made from a non-conductive carrier material, the electrode layer being removed in part-areas in order to form the non-conductive areas.

14. The method as claimed in claim 8, wherein the electrode includes at least three layers is used, wherein the lowest layer is made from a carrier material on which a conductive electrode layer is applied over the entire surface, and wherein the conductive electrode layer is covered with an insulator layer in part-areas in order to form the non-conductive areas.

15. They method as claimed in claim 8, wherein at least one of the following compounds pyrroles, 3-alkylpyrroles, N-alkylpyrroles, N-arylpyrroles, N-naphthylpyrroles, N-heteroarylpyrroles, thiophenes, 3-alkylthiophenes, furans, 3-alkylfurans, 3-methyl-, 3-ethyl-, 3-propylfurans, selenophenes, 3-alkylselenophenes, tellurophenes, anilines, biphenyls, azulenes, 2-(alpha-(3-alkyl)thienyl)thiophenes, 2-(alpha-(3-alkyl)thienyl)-(3-alkyl)thiophenes, 2-(alpha-thienyl)furans, 2-(alpha-(3-alkyl)thienyl)furans, 2-(alpha-(3-alkyl)thienyl)-(3-alkyl)furans, 2-(alpha-thienyl)-(3-alkyl)furans, 2-(alpha-thienyl)pyrroles, 2-(alpha-(3-alkyl)thienyl)pyrroles, 2-(alpha-(3-alkyl)thienyl)-(3-alkyl)pyrroles, 2-(alpha-thienyl)-(3-alkyl)pyrroles, 2-(alpha-furanyl)pyrroles, 2-(alpha-(3-alkyl)furanyl)pyrroles, 2-(alpha-(3-alkyl)furanyl)-(3-alkyl)pyrroles 2-(alpha-furanyl)-(3-alkyl)pyrroles, 2-(alpha-pyrrolyl)pyrroles, 2-(alpha-(3-alkyl)pyrrolyl)pyrroles, 2-(alpha-(3-alkyl)pyrrolyl)-(3-alkyl)pyrroles, 2-(alpha-pyrrolyl)-(3-alkyl)pyrroles, 2-(alpha-selenophenyl)selenophenes, 2-(alpha-(3-alkyl)selenophenyl)selenophenes, 2-(alpha-(3-alkyl)selenophenyl)-(3-alkyl)selenophenes, 2-(alpha-thienyl)selenophenes, 2-(alpha-(3-alkyl)thienyl)selenophenes, 2-(alpha-(3-alkyl)thienyl)-(3-alkyl)selenophenes, 2-(alpha-thienyl)-(3-alkyl)selenophenes, 2-(alpha-selenophenyl)furans, 2-(alpha-(3-alkyl)selenophenyl)furans, 2-(alpha-(3-alkyl)selenophenyl)-(3-alkyl)furans, 2-(alpha-selenophenyl)-(3-alkyl)furans, 2-(alpha-selenophenyl)pyrroles, 2-(alpha-(3-alkyl)selenophenyl)pyrroles, 2-(alpha-(3-alkyl)selenophenyl)-(3-alkyl)pyrroles, 2-(alpha-selenophenyl)-(3-alkyl)pyrroles, thienothiophenes, thienofurans, thienoselenophenes, thienopyrroles, 2-phenylthiophenes, 2-phenylfurans, 2-phenylpyrroles, 2-phenylselenophenes, 2-phenyltellurophenes, N-vinylcarbazole, N-ethynylcarbazone, 3,4-ethylenedioxythiophenes, 2-(alpha-(3,4-ethylenedioxy)thienyl)-3,4-ethylenedioxythiophenes, 2-alpha-(3,4-ethylenedioxy)thienyl-(3-alkyl)thiophenes, 2-(alpha-(3,4-ethylenedioxy)thienyl)furans, 2-(alpha-(3,4-ethylenedioxy)thienyl)-(3-alkyl)furans, 2-(alpha-(3,4-ethylenedioxy(thienyl)pyrroles, 2- (alpha-(3,4-ethylenedioxy)thienyl)-(3-alkyl)pyrroles, 2-(alpha-(3,4-ethylenedioxythienyl)selenophenes or 2-alpha-(3,4-ethylenedioxythienyl)-(3-alkyl)selenophenes are used as the compounds of low molecular weight, and wherein the compounds of low molecular weight have a structure or a group of structures which contains monomer units and oligomeric monomer units.

16. The method as claimed in claim 8, wherein the electrolyte contains a solvent and a salt dissolved in the solvent, the electrolyte being chosen so that the compounds of low molecular weight are soluble in it.

17. The method as claimed in claim 16, wherein at least one of the liquids selected from propylene carbonate, acetonitrile, monovalent or polyvalent alcohols, tetrahydrofuran, and water is used as the solvent.

18. The method as claimed in claim 17, wherein at least one of the substances tetraethylammonium-tetrafluoroborate, tetraethylammonium-hexafluorophosphate, tetraethylammonium-perchlorate and poly(styrenesulphonic acid) sodium salt is used as the salt.

19. The method as claimed in claim 16, wherein at least one of the substances selected from tetraethylammonium-tetrafluoroborate, tetraethylammonium-hexafluorophosphate, tetraethylammonium-perchlorate and poly(styrenesulphonic acid) sodium salt is used as the salt.

20. The method as claimed in claim 8, wherein a structured polymer film with a thickness of 0.1 to 2 μm is produced.

21. The method as claimed in claim 8, wherein the electrode is a rotatable electrode, the rotatable electrode being disposed in such a way that during the rotation, the conductive areas dip into the electrolyte and then are moved out of the electrolyte.

22. The method as claimed in claim 21, wherein the rotatable electrode is a circular cylindrical electrode.

23. The method as claimed in claim 21, wherein the method of producing the structured polymer film is a continuous or quasi-continuous method.

24. A method of producing a conductor structure containing source and drain electrodes at least of a field-effect transistor, comprising:

producing a conductive structured polymer film by the method of claim 8, and forming the conductor structure from the structured polymer film, the structured polymer film defining the source and drain electrodes.

25. The method as claimed in claim 24, further comprising disposing the source and drain electrodes in such a way that a channel length of 2 to 50 μm is produced.

* * * * *